United States Patent [19]
Araki et al.

[11] Patent Number: 4,857,414
[45] Date of Patent: Aug. 15, 1989

[54] AMORPHOUS METAL-METAL COMPOSITE ARTICLE AND A METHOD FOR PRODUCING THE SAME

[75] Inventors: Masatada Araki, Handa; Yutaka Kuroyama; Yukihisa Takeuchi, both of Chita; Makoto Takagi, Okazaki; Yoshihito Kawamura, Ohbu; Toru Imura, Nagoya, all of Japan

[73] Assignee: Nippon Oil & Fats Co., Ltd., Japan

[21] Appl. No.: 180,764

[22] Filed: Apr. 12, 1988

[30] Foreign Application Priority Data

Apr. 20, 1987 [JP] Japan .................... 62-95281

[51] Int. Cl.$^4$ .................. B32B 15/04; B23K 20/08
[52] U.S. Cl. ............................ 428/612; 148/403; 148/902; 228/107
[58] Field of Search .............. 428/687, 609, 612; 228/2.5, 107, 108, 109; 148/902, 304, 403

[56] References Cited

U.S. PATENT DOCUMENTS

| | | | |
|---|---|---|---|
| 4,250,229 | 2/1981 | Kear et al. | 428/606 |
| 4,423,120 | 12/1983 | Paulus et al. | 428/614 |
| 4,448,853 | 5/1984 | Fischer et al. | 428/607 |
| 4,520,078 | 5/1985 | Rubinowitz et al. | 228/107 |
| 4,529,457 | 7/1985 | Kushnick | 148/403 |
| 4,568,014 | 2/1986 | Madsen | 228/116 |
| 4,612,161 | 9/1986 | Cline | 228/108 |
| 4,710,235 | 12/1987 | Scruggs | 148/403 |

FOREIGN PATENT DOCUMENTS

| | | | |
|---|---|---|---|
| 1527509 | 12/1964 | Fed. Rep. of Germany | 228/107 |
| 3412664 | 10/1985 | Fed. Rep. of Germany | 165/133 |
| 103985 | 6/1983 | Japan | 228/190 |
| 16978 | 1/1986 | Japan | 428/658 |
| 132282 | 6/1986 | Japan | 228/107 |
| 167040 | 6/1987 | Japan | 428/659 |

OTHER PUBLICATIONS

D. G. Morris, "Compaction and Mechanical Properties of Metallic Glasses", Metal Science, Jun. 1980, pp. 215–220.

*Primary Examiner*—John J. Zimmerman
*Attorney, Agent, or Firm*—Arnold, White & Durkee

[57] ABSTRACT

An amorphous metal-metal composite article comprising a metal and an amorphous metal thin sheet firmly bonded thereto and having high durability and reliability can be obtained by a method, wherein the surface roughness of a metal to be bonded with an amorphous metal thin sheet is adjusted to a certain surface roughness and an explosion shock is applied to an assembly of the metal and the amorphous metal thin sheet superposed thereon, under a condition that the moving velocity of the collision point of the amorphous metal thin sheet to the metal is higher than the sound velocity in the amorphous metal.

5 Claims, 7 Drawing Sheets

FIG_1a
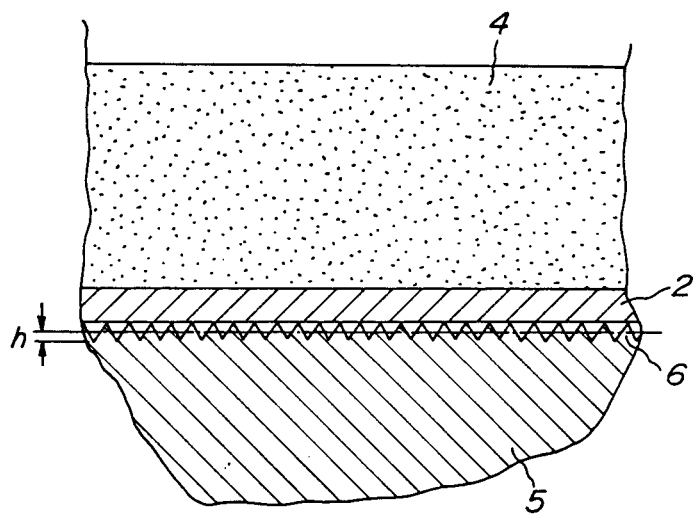
FIG_1b
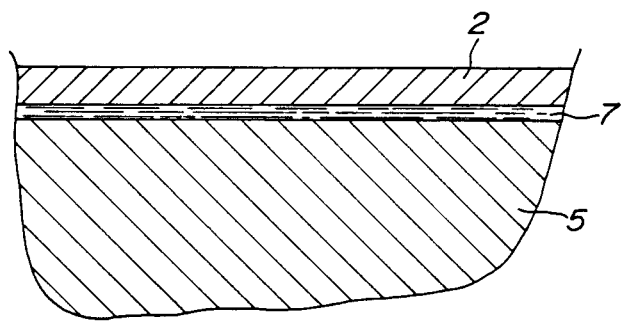

FIG_2
PRIOR ART
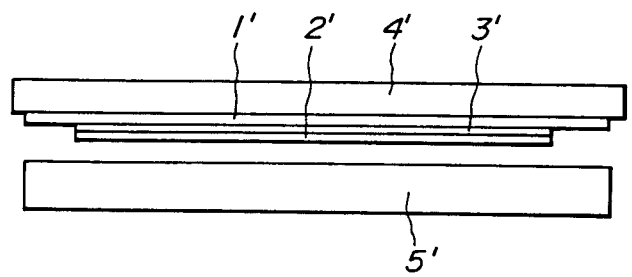
FIG_3
PRIOR ART
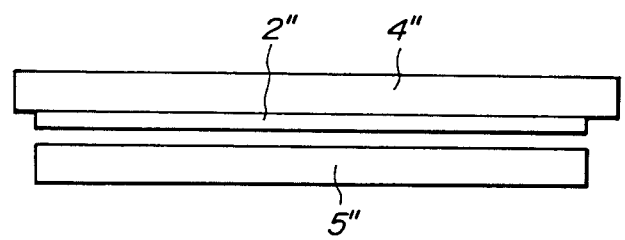

FIG_4a
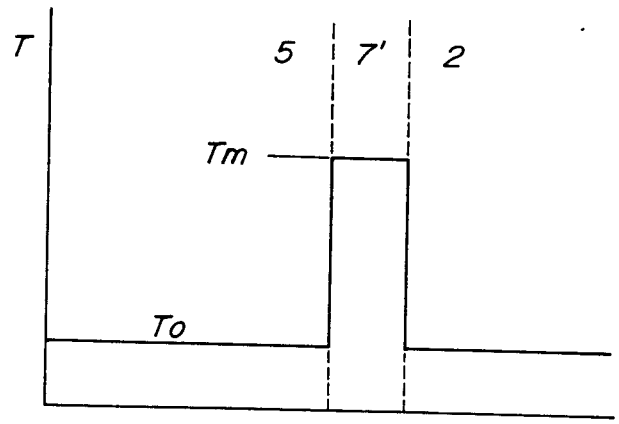
FIG_4b
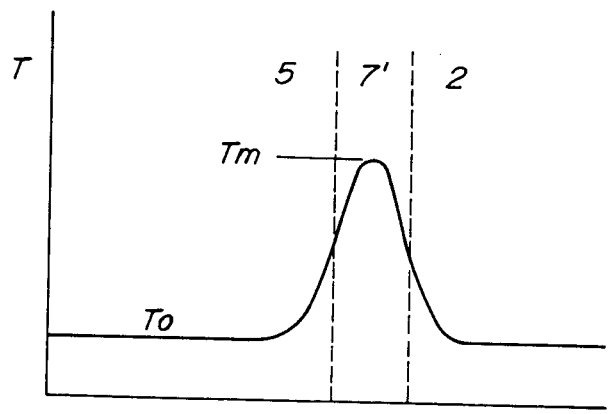

FIG_4c
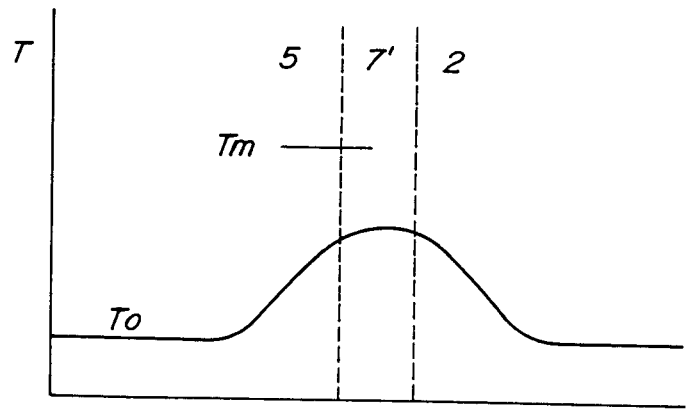
FIG_4d
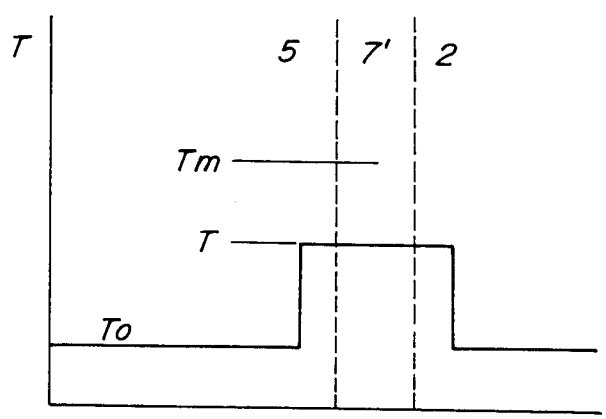

FIG_5
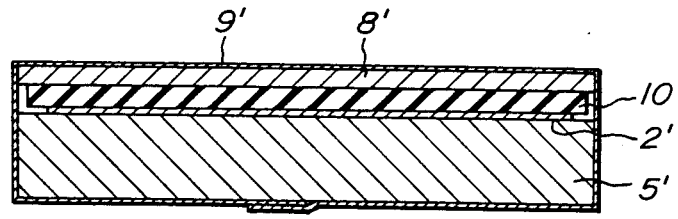
FIG_6
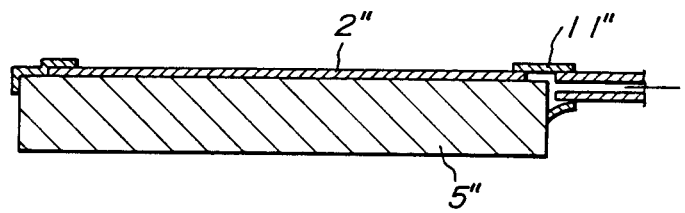
FIG_7
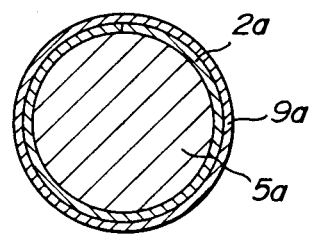

FIG_8
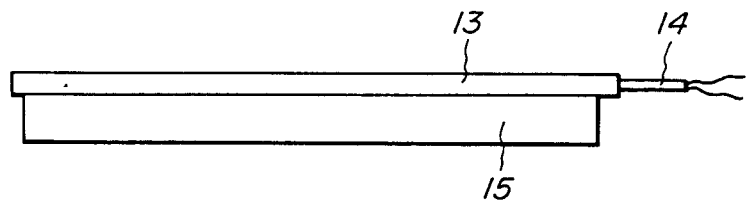
FIG_9
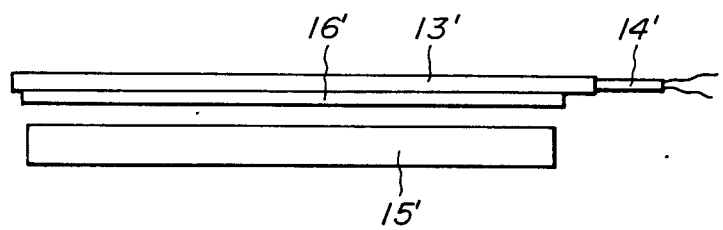
FIG_10
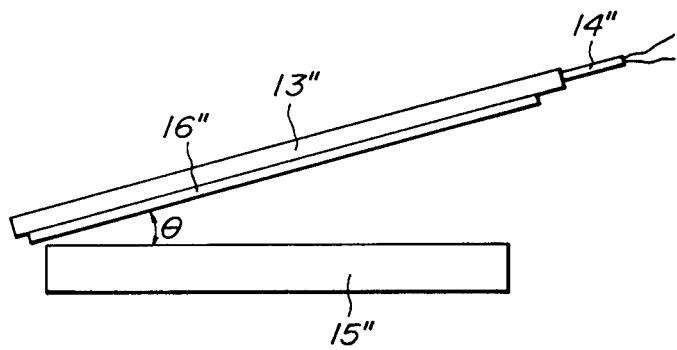

FIG_11
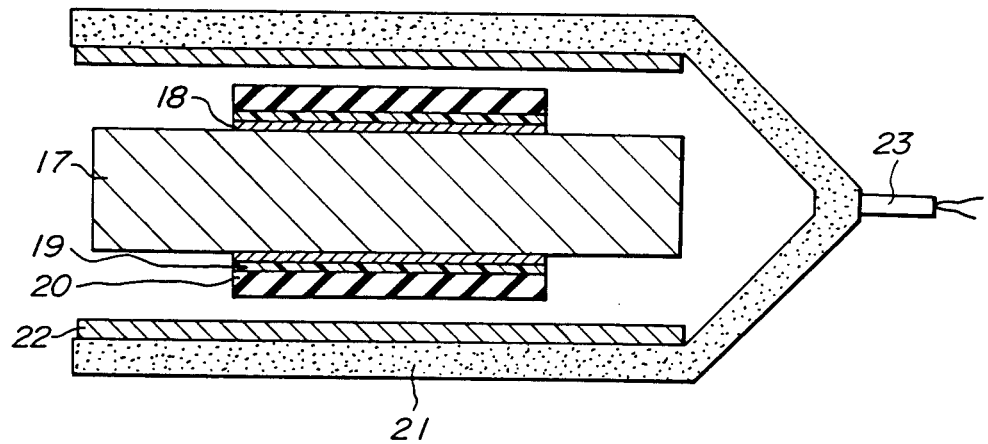

AMORPHOUS METAL-METAL COMPOSITE ARTICLE AND A METHOD FOR PRODUCING THE SAME

BACKGROUND OF THE INVENTION (1) Field of the Invention

The present invention relates to an amorphous metal-metal composite article and a method for producing the same, and more particularly relates to an amorphous metal-metal composite article, comprising an ordinary crystallized metal and an amorphous material (hereinafter may be referred to as amorphous), such as amorphous metal or amorphous alloy, which has been produced from its melted state through rapid cooling and has no crystal structure, firmly bonded to the crystallized metal by the explosion pressure of an explosive, and a method for producing the same.

Amorphous metal has excellent magnetic properties, and hence is attempted to be used as various magnetic materials.

(2) Related Art Statement

Amorphous can be produced by a rapid cooling method or other various methods, such as spatter method, chemical vapor deposit method, plating method and the like. However, the amorphous obtained by these methods are thin sheets, fine wires and powders, all of which have a dimension of less than several hundreds μm, and the use field of these amorphouses is very limited. In order to use amorphous in a wide field, amorphous having a larger dimension is demanded, and a shaped article produced by the compression molding of amorphous metal powder has been disclosed (Japanese Patent Laid-open Specification No. 61-139,629).

Japanese Patent Laid-open Specification No. 61-195,905 discloses an amorphous-covered metal obtained by a method wherein an amorphous metal powder is bonded to a metal matrix by an explosion pressure; and Japanese Patent Laid-open Specification No. 62-23,905 discloses a method for producing a composite sintered article from an amorphous metal powder and a metal powder by utilizing a high energy shock.

There has been proposed a technic, wherein an amorphous metal thin sheet having a thickness of not larger than 100 μm is bonded to a sheet or round rod of metal by an explosion pressure to produce a composite article having both of the excellent magnetic properties inherent to amorphous metal and the high strength inherent to metal (Magnetic Society of Japan, 10th Autumn Annual Meeting Preprint No. 4PC-10 (page 61) (1986, 11), Ichiro Sasada et al, "Properties of Torque Sensor produced by the Explosion Bonding Method"). Further, Japanese Patent Laid open Specification No. 61-132,282 discloses a method for bonding an amorphous metal to a metal by an explosion pressure in order to produce an amorphous metal-metal composite article which has a clearance between the amorphous metal and the metal and is used as an electrode in a chlorine-generating electrolysis.

As a method for bonding a metal thin sheet having a thickness of about 100 μm to a metal sheet by an explosion pressure, there has been known a method, for example, illustrated in FIG. 2. In the method of FIG. 2, a metal thin sheet 2' is adhered to a metal sheet 1' having a thickness of about 1-2 mm by the use of an adhesive 3', an explosive layer 4' is arranged on the metal sheet 1' at the surface opposite to the surface adhered with the metal thin sheet 2', the laminate of the metal thin sheet 2', metal sheet 1' and explosive layer 4' is arranged such that the surface of the metal thin sheet 2', which surface is opposite to the surface adhered with the metal sheet 1', is faced with a clearance to a metal 5' to be bonded with the metal thin sheet 2', and the explosive 4' is detonated to apply an explosion pressure through the metal sheet 1' having a thickness of 1-2 mm to the metal thin sheet 2' and to collide the metal thin sheet 2' to the metal 5' at a high velocity.

It is known that, when it is intended to bond a metal sheet to another metal sheet, for example, to bond a sheet of a metal, such as titanium or the like, to a steel sheet, a good result is obtained by previously polishing the surfaces of both the metal sheets to a surface roughness of not larger than approximately 0.7 μm and then bonding both the members to each other (Japanese Patent Application Publication No. 42-24,982).

In the conventional amorphous metal-metal composite article produced by the use of amorphous metal powder, the amorphous metal portion has a block shape, round rod shape or annular shape having a certain thickness. Moreover, the amorphous metal portion is produced by compacting powders. Therefore, the conventional amorphous metal-metal composite article is poor in strength, and can not be used, for example, as a torque sensor for detecting the torque of engine.

In order to eliminate these drawbacks, there has been proposed to produce a sintered article by the use of a combination of an amorphous metal powder and a metal powder. However, the resulting sintered article is still insufficient in the strength. Moreover, a minute observation of the amorphous metal sintered body portion shows that the portion is formed of individual particles of powders bonded to each other, and therefore the amorphous metal sintered body portion has a slight magnetical strain at the boundary of the particles, and the resulting sintered shaped article is apt to be poor in the magnetic properties as a whole.

Conventional method for producing a composite article of an amorphous metal thin sheet and a metal sheet is free from the drawbacks of the conventional sintered article produced by the use of a combination of an amorphous metal powder and a metal powder, which drawbacks are poor in the strength of the resulting shaped article and in the magnetic properties at the bonding boundary of fellow particles, but still has several drawbacks. One of the drawbacks is that the amorphous metal thin sheet has a thickness of 100 μm or less, and predominantly has a thickness of about 20–30 μm, and therefore when it is intended to bond the amorphous metal thin sheet to a metal sheet by an explosion pressure, the amorphous metal thin sheet is deformed, and a composite article having a smooth surface can not be obtained, or only a composite article having locally bonded portions is obtained. Further, during the bonding of the amorphous metal thin sheet to the metal sheet, the bonding interface of the amorphous metal thin sheet and the metal sheet is exposed to a high temperature, and the amorphous metal thin sheet is often crystallized in many portions due to the high temperature, and excellent magnetic properties are lost in the resulting composite article. Moreover, although a method, wherein an amorphous metal thin sheet is collided to a metal at a high velocity to bond them with each other, can be carried out in principle, it is practically difficult to produce a composite article having a good bonded state, and the method can not be practically used.

The inventors have variously studied the drawbacks of the above described conventional methods in order to find out an effective means for bonding an amorphous metal thin sheet to a metal sheet.

There are probably the following two reasons as a reason why an amorphous metal thin sheet bonded to a metal does not have a smooth surface.

(1) In the conventional method for bonding a metal sheet to another metal sheet or a metal block by utilizing an explosion pressure, as illustrated in FIG. 3, a metal sheet 2" is arranged in parallel to a metal sheet 5" with a small clearance, an explosive layer 4" is arranged so as to be in contact with that surface of the metal sheet 2" which is opposite to the surface faced to the metal sheet 5", the explosive 4" is detonated from its one end to fly the metal sheet 2" at a high velocity by the explosion pressure and to collide the metal sheet 2" to the metal sheet 5", whereby the collision point is continuously moved corresponding to the proceeding of the explosion, and the metal sheet 2' is bonded to the metal sheet 5". In this method, when the metal sheet 2" is thin, the metal sheet 2" is plastically deformed or sometimes broken due to the strain caused by the explosion pressure during the course of the flying by the explosion pressure before the collision to the metal sheet 5", and a distorted composite article or a composite article, wherein the metal sheet 2" in a broken state is bonded to the metal sheet 5", is often obtained. Particularly, when it is intended to use an amorphous metal sheet, which is a subject material to be used in the present invention, in place of the metal sheet 2", and to bond the amorphous metal sheet to a metal sheet 5", the amorphous metal sheet is often broken before its collision with the metal sheet 5" or often bonded unsatisfactorily to the metal sheet 5" by an undesirable strain due to the reason that the amorphous metal sheet is hard but is poor in deformability and further is thin.

(2) It has been thought that the above described drawbacks of the deformation and breakage of the metal sheet 2" during its flying can be obviated, for example, by a method, wherein a metal sheet 2' is adhered to a metal sheet 1' having a thickness of about 1-2 mm by means of an adhesive 3' and an explosion pressure is applied to the metal sheet 2' through the metal sheet 1' as described above. However, although the metal sheet 2' is prevented from being deformed and broken during the course of flying, a mutual plastic fluidization of the metal sheet 2' and the metal sheet 5' occurs at the bonding interface of both the members during the course of the bonding thereof, and the plastic fluidization has an adverse influence upon the shape of the surface of the metal sheet 2' to form often a corrugate surface or to form often a composite article having a broken surface. The reason is probably as follows. It has been known that, when metals are bonded to each other by the explosion, it is necessary that the collision point of both the metals moves at a velocity lower than the sound velocity in either the metal sheet 2' or the metal sheet 5'. It has been known that, when this requirement is satisfied, a plastic fluidization occurs at the interface of the metal sheet 2' and the metal sheet 5', and both the metal sheets are firmly bonded with each other while when this requirement is not satisfied, the metal sheet 2' and the metal sheet 5' are repelled with each other, and are not bonded with each other. That is, when it is intended to bond a metal to a metal or to bond an amorphous metal to a metal by the use of explosion pressure in a conventional technic, it is an essential requirement to cause a plastic fluidization at their bonding interface, and if the plastic fluidization does not occur, both the metal sheets are not able to be bonded with each other. However, the essential requirement for attaining the bonding is the cause of the deformation of the surface of an amorphous metal thin sheet or the breakage of the amorphous metal thin sheet during the bonding of the thin sheet to a metal sheet. That is, there is an antinomy in the bonding of an amorphous metal thin sheet to a metal sheet. Particularly, amorphous metal has a high hardness and is difficult to be deformed, and when it is intended to deform forcedly an amorphous metal thin sheet by applying a large strain, the amorphous metal thin sheet is broken. Therefore, the above described problems probably highly influence upon amorphous metal thin sheet higher than upon ordinary metals.

In order to solve the above described problems, the followings are considered.

(1) In order to prevent the deformation of an amorphous metal thin sheet during the course of flying by the explosion pressure, the flying distance should be made small as possible, and if possible, the amorphous metal thin sheet should be bonded to a metal sheet without the flying of the amorphous metal thin sheet by the explosion pressure.

(2) In order to make small as possible the plastic fluidization at the bonding interface of an amorphous metal thin sheet with a metal sheet, the collision point of both the sheets at their bonding interface should be moved at a velocity higher than the higher sound velocity between the sound velocity in the amorphous metal thin sheet and that in the metal sheet to suppress the plastic fluidization as small as possible and a novel method for bonding both the sheets in a satisfactorily high strength should be developed.

(3) Even when the above described requirements have been attained, it is necessary to suppress the crystallization of amorphous metal as low as possible in order to maintain the excellent properties of the amorphous metal. Therefore, the width of the range, in which the amorphous metal reaches its crystallization temperature, should be made small as possible.

The inventors have made various theoretical and experimental investigations for attaining these requirements, and have accomplished the present invention.

SUMMARY OF THE INVENTION

According to the present invention, in order to satisfy the above described requirements (1), (2) and (3), a metal sheet is made into a certain surface roughness at the surface to be bonded with an amorphous metal thin sheet, and the amorphous metal thin sheet is tightly contacted to and superposed on the rough surface of the metal sheet, and an explosion pressure is applied to the surface (hereinafter, referred to merely "surface") of the amorphous metal thin sheet, which surface is opposite to the surface faced to the metal sheet superposed thereon, to bond the amorphous metal thin sheet to the metal sheet. In this case, in order to attain the requirement (2), the explosion pressure applied to the surface must be a shock which impacts the surface planely or moves on the surface at a velocity higher than the sound velocity in the amorphous metal thin sheet. Strictly speaking, the shock by the explosion pressure must be a shock caused by the movement of the collision point of the amorphous metal and the metal. Further, in order to attain the requirement (3) and concurrently to suppress the plastic fluidization to the smallest necessary amount, it is preferable that center line average surface roughness of the surface of the metal to be bonded with the amorphous metal thin sheet is higher than 1 μm but not higher than 10 μm.

One of the features of the present invention lies in an amorphous metal-metal composite article, comprising a metal and an amorphous metal thin sheet bonded together by an explosion with the bonding interface between the amorphous metal thin sheet and the metal being substantially plane, and crystallized portion, which has been formed by the crystallization of the amorphous metal during the bonding, being present along the interface of the amorphous metal and the metal, and the width of the non-crystallized portion of the amorphous metal being at least 10 μm, and a non-crystallized portion of the amorphous metal thin sheet being substantially homogeneous.

Another feature of the present invention lies in a method for producing an amorphous metal-metal composite article, wherein an amorphous metal thin sheet is bonded to a metal by applying an explosion shock to an assembly comprising the metal and the amorphous metal thin sheet superposed thereon, the improvement comprising plastically deforming the rough portion on the metal surface by the collision of the amorphous metal at a high velocity to the rough surface of the metal such that the moving velocity of the colliding portion, at which the amorphous metal thin sheet is pressed to the metal, is higher than the sound velocity in the amorphous metal and the width of that portion of the amorphous metal which is heated to a temperature higher than 900° C. is smaller than the value obtained by subtracting 10 μm from the thickness of the amorphous metal under an assumption that the rough portion on that surface of the metal which is faced to the amorphous metal has been wholly melted by the heat generated by the collision, and the heat has been equally distributed to the limited width of the amorphous metal and the metal.

BRIEF DESCRIPTION OF THE DRAWINGS

FIGS. 1a and 1b are views for explaining the principle of the method of the present invention;

FIG. 2 is a diagrammatical view illustrating one embodiment of a conventional method for bonding a metal thin sheet to a metal sheet by the use of an explosive;

FIG. 3 is a diagrammatical view for explaining a problem in a conventional method for bonding a metal sheet to another metal sheet by the use of an explosive;

FIGS. 4a, 4b, 4c and 4d are views for explaining the mechanism of crystallization of an amorphous metal thin sheet in the present invention;

FIG. 5 is an explanative view illustrating one embodiment of the method for closing in contact tightly an amorphous metal thin sheet to a metal sheet in the present invention;

FIG. 6 is an explanative view illustrating another embodiment of the method for closing in contact tightly an amorphous metal thin sheet to a metal sheet in the present invention;

FIG. 7 is an explanative view illustrating one embodiment of the method for closing in contact tightly an amorphous metal thin sheet to a cylindrical metal in the present invention;

FIG. 8 is a diagrammatical view illustrating one embodiment of the method for applying an explosive strain to one embodiment of an assembly containing a metal sheet and an amorphous metal thin sheet tightly contacted thereto in the present invention;

FIG. 9 is a diagrammatical view illustrating another embodiment of the method for applying an explosion strain to another embodiment of the assembly in the present invention;

FIG. 10 is a diagrammatical view illustrating a modification of the method of FIG. 9; and FIG. 11 is an explanative view illustrating an application of the method of FIG. 9 to the cylindrical assembly containing a metal cylinder and an amorphous metal thin sheet tightly contacted thereto.

DESCRIPTION OF THE PREFERRED EMBODIMENT

The present invention will be explained hereinafter in more detail referring to the drawings.

According to the present invention, an amorphous metal thin sheet can be bonded to a metal having any shapes. However, in the practical operation, it is demanded to fly an amorphous metal thin sheet in a smallest distance of a vacant space and to suppress the generation of strain in the amorphous metal thin sheet as small as possible. Accordingly, it is necessary to contact the amorphous metal thin sheet tightly to the metal surface. Of course, it is necessary that the metal surface has a certain surface roughness, and hence it is impossible to contact tightly the amorphous metal thin sheet to the metal over the whole area without the formation of gaps. As have been explained, it is necessary to give a rough surface to a metal, to which an amorphous metal thin sheet should be bonded, and therefore the amorphous metal thin sheet must be tightly closed in contact as possible to the imaginary surface obtained by connecting the peaks of waves of the metal surface. The amorphous metal thin sheet is mainly produced by a roll process at present, and hence can be bent in one direction without forming creases. However, the amorphous metal thin sheet cannot be bent simultaneously in two or more directions without forming creases. Accordingly, the amorphous metal-metal composite article obtained in the present invention has a shape having a plane surface or a surface curved only in one direction.

In the present invention, it is desirable that amorphous metal and metal surface are tightly closed in contact as possible. When amorphous metal is not tightly contacted to metal surface, but is floated up from the metal surface even only in one portion, the amorphous metal is broken at the floated portion, or can not be satisfactorily bonded to the metal surface at the floated portion. The reason is that he amorphous metal is used in the form of a thin sheet and is generally supplied and storaged in a wound state, and therefore the amorphous metal thin sheet has a tendency to curve, and does not always agree to the shape of the metal surface to be bonded. In order to eliminate the influence of this tendency and to adhere tightly the amorphous metal thin sheet to the metal surface, a compulsory method is required. First, when the metal surface to be bonded with the amorphous metal thin sheet is plane, the amorphous metal thin sheet can be tightly closed in contact to the metal surface in the following manner as illustrated in FIG. 5. Referring to FIG. 5, an amorphous metal thin sheet 2' is superposed on a metal 5', the surface of the amorphous metal thin sheet 2' is covered with an elastomer 10, such as rubber sheet or plastic sheet, another metal sheet 8' is further superposed on the upper surface of the elastomer 10, and the resulting laminate is bound with a plastic adhesive tape 9' under tension such that the elastomer 10 can be compressed. The compressed elastomer 10 generates a strain which acts to restore the elastomer to its original state and to press the amorphous metal thin sheet 2' to the metal sheet 5', and hence the amorphous metal thin sheet 2' is tightly closed in contact to the metal sheet 5' at their interface. The metal sheet 8' and elastomer 10 not only act to press forcedly the amorphous metal thin sheet 2' to the metal sheet 5', but also act to protect the surface of the amorphous metal thin sheet 2', which is thin and is easily deformed and broken by the explosion shock, and simultaneously to adjust the transmission time of the shock. The relation between the kinds and dimensions of the metal sheet 8' and the elastomer 10 and their protecting action and their shock transmission time-adjusting action can be easily found out referring to the Examples of the present invention by those skilled in the art. Another method for closing in contact tightly an amorphous metal thin sheet to a metal sheet is a method illustrated in FIG. 6. Referring to FIG. 6, the edge of an amorphous metal thin sheet 2'' is covered with an airtight tape 11'', and the interfacial portion of the superposed amorphous metal thin sheet and metal sheet is evacuated by means of a vacuum pump 12'', whereby the amorphous metal thin sheet 2'' is tightly closed in contact to the metal sheet 5'' by utilizing the atmospheric pressure. In this case, as an auxiliary means for maintaining the vacuum, a vacuum compound or a sealing material can be used insofar as the use of these elements has no adverse influence upon the application of the explosion shock to the amorphous metal thin sheet 2''. The same effect as described above can be obtained by a method, wherein an amorphous metal thin sheet 2'' is superposed on a metal sheet 5'', the resulting laminate is placed in an airtight plastic bag, and the interior of the bag is evacuated by means of a vacuum pump, in place of a method, wherein the edge of an amorphous metal thin sheet 2'' is covered with an airtight tape 11'' and the interface of these members is evacuated by means of a vacuum pump 12'. In this case also, another metal sheet and the elastomer can be used. However, whether or not another metal sheet is used can be easily determined by those skilled in the art.

Of course, in both of the above described cases, the explosion shock is applied to the surface of an amorphous metal thin sheet 2' or 2'', which surface is not faced to the metal sheet 5' or 5'' to be bonded with the amorphous metal thin sheet 2' or 2''. The method for applying the explosion shock will be explained later in detail.

When a metal sheet to be bonded with an amorphous metal thin sheet has a curved surface, the methods illustrated in FIGS. 5 and 6 can be principly used. However, when the metal sheet to be bonded with the amorphous metal thin sheet has a cylindrical shape, the method illustrated in FIG. 7 can be used. FIG. 7 is a cross-sectional view of a laminate, which has been formed by tightly closing in contact an amorphous metal thin sheet 2a to the surface of a metal cylinder 5a in order to bond the amorphous metal thin sheet 2a to the surface of the metal cylinder 5a, in a direction perpendicular to the axis of the metal cylinder 5a. In this embodiment, a plastic adhesive tape 9a is wound around the amorphous metal thin sheet 2a under tension, whereby both the members are tightly closed in contact to each other by utilizing the shrinking force of the tape 9a. In the case of FIG. 5, the metal sheet 5' has a plane shape, and hence the amorphous metal thin sheet 2' and the metal plate 5' can not be tightly closed in contact to each other at their center portions by means only of the shrinking force of the plastic adhesive tape 9', and it is necessary to utilize the restoring power of an elastomer 10, such as rubber sheet or plastic sheet. However, when a metal to be bonded with an amorphous metal thin sheet has a cylindrical shape, the shrinking force of the adhesive tape 9a, a heat-shrinkable tube or the like can be transmitted to all over the surface of the amorphous metal thin sheet 2a without the use of not only an elastomer 10, such as rubber sheet or plastic sheet, but also a metal sheet 8' arranged outside the elastomer 10. Moreover, the method illustrated in FIG. 7 can be utilized not only a cylindrical surface, but also a curved surface obtained by cutting and removing a part of cylinder. In this case, only the plastic adhesive tape 9a can be utilized as a protecting agent for the amorphous metal thin sheet in place of the elastomer 10 and the metal sheet 8' used in FIGS. 5 and 6, depending upon the explosion state.

The method for forming a rough surface will be explained. There are two types in the rough surface of a metal sheet to be bonded with an amorphous metal thin sheet in the present invention. The one is a rough surface, which is obtained by the working by a lathe or shaper, and has regular patterns regularly repeated. The other is a rough surface, which is formed by the working by the grinding wheel or sand paper, and has a random surface shape having a certain width in the value of roughness. Both types of the rough surfaces can be used in the present invention. The only difference lies in the handling of the wave shape on the surface of the metal sheet in the case where the volume V of the portion which is plastically deformed and melted is deduced. Accordingly, there is substantially no difference between the two types of the rough surfaces. The roughness of the surface is represented by the center line average surface roughness and will be explained later.

An explanation will be made with respect to the protection of the amorphous metal thin sheet in the present invention. The surface of the amorphous metal thin sheet may be broken or stained by the explosion load. According to the method illustrated in FIG. 5, the elastomer 10, the metal sheet 8' and the plastic adhesive tape 9' act to prevent the amorphous metal thin sheet 2' from being broken and stained. In the other methods also, a material used as a means for closing in contact tightly the amorphous metal thin sheet to the metal sheet can be used as a protecting material for the surface of the amorphous metal thin sheet. When the protecting action of the protecting material is short, the material used in the method of FIG. 5 is auxiliary used to protect the surface of the amorphous metal thin sheet, whereby the surface can be prevented from being broken and stained. The kind of protecting materials and the protecting methods can be easily determined by those skilled in the art referring to the Examples of the present invention.

Then, an explanation will be made with respect to the method for applying a shock to the amorphous material thin sheet in the present invention. In the specification of the present invention, the basic method for applying the explosion shock to the amorphous metal thin sheet will be explained as a typical embodiment. The method itself for applying the explosion shock on the amorphous metal thin sheet neither constitutes a part of the present invention, nor limits the present invention, except the requirement relating to the moving velocity of the shock on the surface of an amorphous metal thin sheet. The essential requirement for carrying out the present invention is that an amorphous metal thin sheet is pressed onto the surface of a metal sheet at a high velocity. In this case, conditions necessary for bonding an amorphous metal thin sheet with a metal sheet uniformly over the whole area under a good surface state have been already specifically explained hereinbefore. The remaining problem is that a condition relating to the strength of shock and the method for applying the shock to the laminate of an amorphous metal thin sheet and the metal sheet is determined in order to press the amorphous metal thin sheet to the metal sheet at a high velocity and to bond them to each other. If this problem is a simple problem, wherein an amorphous metal thin sheet is merely superposed on a metal sheet, and n explosion shock is merely applied to the surface of the amorphous metal thin sheet, the strength of shock to be applied to the amorphous metal thin sheet surface can be easily determined. However, in the present invention, one of the materials to be bonded to each other is an amorphous metal thin sheet, which is very difficult to be bonded to a metal sheet uniformly over the whole area under a good surface state, and therefore an elastomer, such as rubber sheet or plastic sheet, is arranged on the surface of the amorphous metal thin sheet, and further a metal sheet, a plastic adhesive tape or the like is arranged on the elastomer so as to cover the surface of the elastomer. Accordingly, the transmitting state of the explosion shock applied to the amorphous metal thin sheet is not uniform depending upon the state covering the amorphous metal thin sheet surface, and it is difficult to generalize and define the strength of explosion shock to be applied to the amorphous metal thin sheet surface and the method for applying the shock to the sheet surface. However, the condition for obtaining a good bonding of the amorphous metal thin sheet to the metal sheet can be easily found out by those skilled in the art by carrying out some experiments referring to the Examples of the present invention.

FIG. 8 is a side view illustrating one embodiment of a method for applying an explosion strain to a combination 15 (hereinafter, referred to as "assembly 15" consisting of a metal sheet and an amorphous metal thin sheet superposed on the metal sheet. Referring to FIG. 8, an explosive layer 13 containing an electric detonator 14 arranged therein is arranged on the assembly 15. The assembly 15 can be produced by an optional method, for example, produced by the method illustrated in FIG. 5, the method illustrated in FIG. 6 and other optional methods insofar as the methods can satisfy the above described various requirements. In the present invention, the essential requirement is that the explosion velocity of the explosive layer 13, that is, the moving velocity of the point, at which the lower surface of the amorphous metal is pressed to the metal surface, along the detonating direction of explosion, is higher than the sound velocity in the amorphous metal. When the moving velocity of this pressing point is lower than the sound velocity in the amorphous metal, the amorphous metal is plastically fluidized to cause a poor bonding with a metal sheet, or to form a wave shape having a deformed pattern on the amorphous metal surface. This deformed pattern of wave shape is often enlarged, resulting in the breakage of the amorphous metal.

In the method illustrated in FIG. 8, an explosion shock is directly applied to the assembly. While, in the method illustrated in FIG. 9, an explosive layer 13' is arranged on a metal sheet 16', and when an electric detonator 14' is detonated, the explosive layer 13' is detonated to fly downwardly the metal sheet 16', and the metal sheet 16' is collided to the surface of the assembly 15' In this case, when the explosion velocity of the explosive layer 13' in a direction opposite to the electric detonator 14' is represented by D, the moving velocity of the collision point of the metal sheet 16' to the surface of the assembly 15', which collision point moves in the same direction as that of the detonating direction of the explosion, is represented by U0, and the moving velocity of the point, at which the lower surface of the amorphous metal is pressed to the metal surface, in the detonating direction of the explosion is represented by U1, the following relation is established between these elements.

$$D = U0 = U1 \quad (3)$$

When the above described condition that the moving velocity of the point, at which the lower surface of the amorphous metal is pressed to the metal surface, in the detonating direction of explosion exceeds the sound velocity C0 in the amorphous metal, is added to the formula (3), the following formula (3)' is obtained.

$$D = U0 = U1 > C0 \quad (3)'$$

The method illustrated in FIG. 9 is an effective method in the case where the explosion pressure is thought to be short to make good bonding by using a method described above.

FIG. 10 illustrates a modification of the method of FIG. 9. In the method of FIG. 10, a metal sheet 16' is inclined at an angle $\theta$ with respect to the assembly 15". According to this method, even when the explosion velocity D is lower than the sound velocity C0 in the amorphous metal, it is possible to obtain a condition of U0=U1>C0 by adjusting the angle $\theta$. The proper value of $\theta$ depending upon the values of D0 and C0 can be easily determined by those skilled in the art referring to the Examples of the present invention. This arrangement leads to such a condition of U0=U1=$\infty$, wherein a plane shock is applied by the use of a commonly known plane wave-generator, and such condition can be easily set by those skilled in the art.

FIG. 11 is a cross-sectional view illustrating a method for applying an explosion shock to an assembly of a metal cylinder and an amorphous metal thin sheet superposed thereon according to the present invention.

In the method illustrated in FIG. 11, an amorphous metal thin sheet 18 is superposed on the surface of a metal cylinder 17, and a plastic adhesive type 19 is wound around the amorphous metal thin sheet 18 under tension to contact tightly the amorphous thin sheet 18 to the surface of the metal cylinder 17, and further a rubber sheet 20 for protecting the surface of the amorphous metal thin sheet 18 is arranged on the outer side of the plastic adhesive tape 19 and adhered thereto by means of an adhesive to form an assembly containing the metal cylinder 17 and the amorphous metal thin sheet 18 superposed thereon. A metal tube 22 having an explosive layer 21 wound around its outer periphery is arranged with a clearance on the outer side of the above obtained assembly in a concentrical position with respect to the axis of the metal cylinder 17. FIG. 11 is a cross-sectional view of a case, wherein the method illustrated in FIG. 9 is used in the assembly of a metal cylinder and amorphous metal thin sheet superposed thereon. In the method illustrated in FIG. 11, when an electric detonator 23 is detonated, the explosive 21 is detonated in a direction opposite to the detonator 23 in an explosion velocity expressed by the formula (3). When the condition for bonding an amorphous metal thin sheet to a metal is satisfied, the explosive 21 can be directly wound around the rubber sheet 20 without the use of the metal tube 22.

In addition to the above described methods, various method for applying an explosion pressure can be used when the above described requirements are satisfied.

An explanation will be made with respect to the method for setting the moving velocity of collision point. There has been minutely explained in this specification that one of the essential requirements in carrying out the present invention lies in that the moving velocity, in the detonating direction of explosion, of that portion of the point, at which the lower surface of an amorphous metal thin sheet is pressed to metal surface, is higher than the sound velocity in the amorphous metal. However, the sound velocity in the amorphous metal has not yet been explained.

Various amorphous metals have hitherto been developed, and although various data have been published, substantially no data relating to sound velocity in the amorphous metal have been published. However, when the bulk modulus K0 and density $\rho 0$ are known, the sound velocity C0 can be easily calculated by the formula (4).

$$C0 = (K0/\rho 0)^{\frac{1}{2}} \quad (4)$$

However, there are few cases wherein both data of bulk modulus K0 and density $\rho 0$ are known, and the sound velocities C0 with respect to all amorphous metals are not always obtained. Bearing these problems in mind, the inventors have calculated the sound velocities in amorphous metals, whose bulk modulus and density are known. As the result, it has been found that the sound velocity in substantially all amorphous metals lies between 4 km/sec and 5 km/sec. Accordingly, when the sound velocity C0 in an amorphous metal is known, if the moving velocity U1 of the point at which the lower surface of the amorphous metal is pressed to the metal surface is set to at least 5 km/sec, a good amorphous metal-metal composite article is obtained.

In the amorphous metal-metal composite article obtained by the above described method according to the present invention, an amorphous metal thin sheet is used, and therefore the composite article is free from the magnetic strain which is caused in the use of an amorphous metal powder. That is, in the composite article, the non-crystallized portion of the amorphous metal is substantially homogeneous.

The reason why a good composite article is obtained is probably as follows.

When the surface of an amorphous metal thin sheet is exposed to an explosion pressure, the amorphous metal thin sheet is pressed to the surface of a metal, which surface has a certain surface roughness, under a high strain, and the rough portion of the metal surface is rapidly crushed, and the excess energy of the deformation energy is converted into heat, and hence the deformed portion becomes high temperature and is formed into a melted state or a semi-melted state, and the amorphous metal thin sheet is tightly welded to the metal. The heat energy of the melted or semi-melted portion is removed by the amorphous metal thin sheet and metal through the heat conduction, and the melted or semi-melted portion is solidified. In this case, that portion of the amorphous metal thin sheet which is contacted to the metal is probably temporarily heated at a temperature higher than the crystallization temperature of the amorphous metal. However, this heating time is very short. Moreover, when the surface roughness of the metal surface is previously controlled within a certain range, the amount of melted or semimelted portion can be suppressed corresponding to the surface roughness, and hence the amount of heat energy to be generated is probably controlled.

FIG. 1a is a view for explaining the principle of the method of the present invention, and illustrates a part of each of an explosive 4, an amorphous metal thin sheet 2 and a metal 5. The projection 6 represents a rough portion on the metal surface, and the reference h represents the center line average surface roughness Ra. The surface roughness is generally represented by the mark Ra. The mark Ra means an average value (unit: $\mu$m) of distances of a cross-sectional curve of the surface, which curve has been obtained by removing components having a wavelength longer than a certain length (which component is waviness or flatness) from the original cross-sectional curve of the surface, from the center line of the cross-sectional curve of the surface. When an explosive is detonated, the amorphous metal thin sheet 2 crushes at a high velocity the projections 6 of the metal 5 by its very strong shock pressure, and is tightly adhered to the metal 5. The projections 6 are crushed in a very short period of time, and hence among the heat generated by the crushing, the amount of heat transferred to the amorphous metal thin sheet 2 and to the flat portion of the metal 5 is small, and the projections 6 are heated up to a high temperature by their rapid deformation and are changed into a melted or semi-melted state. It is thought that the amorphous metal is pressed to the metal at a velocity within the range of several hundreds m/sec to one thousand and several hundreds m/sec. For example, when it is assumed that the height of the projection 6 is 10 $\mu$m, the time required from the beginning of deformation of the projection 6 of the metal 5 to the completion of tight adhesion of the amorphous metal 2 to the flat portion of the metal 5 is within the range between several nano seconds to several tens nano seconds (from one-several hundreds millionth second to one-several tens millionth second). Accordingly, it can be understood that there is no time for the generated heat to transfer. Due to the above described action, the melted or semi-melted layer is formed between the amorphous metal thin sheet 2 and the flat portion of the metal 5 and moreover the amorphous metal thin sheet 2 is closely pressed to the metal 5 by a strong pressure of explosion, and as the result the amorphous metal thin sheet 2 is firmly bonded to the metal 5 through a melt-solidified layer 7 as illustrated in FIG. 1b.

FIGS. 4a–4d are views illustrating diagrammatically the temperature hysteresis, wherein the projection 6 illustrated in FIG. 1a is crushed to generate heat, is cooled, and is finally formed into a melt-solidified layer 7 illustrated in FIG. 1b. FIG. 4a is a view illustrating a state, wherein it is assumed that the projection is melted to form a melted layer 7', and the heat is not yet transferred to the amorphous metal 2 and to the metal 5. In FIG. 4a, the reference T represents temperature. FIG. 4a means that the temperature of the melted layer 7' or the melting temperature of the metal is Tm and the temperature of the amorphous metal or the temperature of the metal is room temperature T0. Strictly speaking, both the amorphous metal and the metal are compressed by the explosion shock, and the temperature thereof after the shock is higher than that thereof before the shock, but the temperature rising is about several tens degree in centigrade, and the temperature rising of the amorphous metal or of the metal by the shock is very small as compared with the melting temperature of the metal, and this temperature rising can be ignored.

FIG. 4b is a diagrammatical view illustrating a temperature distribution in a state a little after the state illustration in FIG. 4a. FIG. 4c is a diagrammatical view illustrating a temperature distribution in a state at little after the state illustrated in FIG. 4b. When the temperature of melted layer 7', and the heat transfer coefficient of amorphous metal and that of metal are known, the amount of the surface roughness to be given to a metal can be found out by a calculation. However, such an investigation is not so important for the practical purpose that how the heat of the melted layer is transferred to the surroundings with the lapse of time to cause the temperature variation in the surroundings. Therefore, the following assumption is made from the practical view point, and the surface roughness of a metal, which can result in a good composite article, is examined. FIG. 4d is a diagrammatical view illustrating a temperature distribution under such a modification that the temperature distribution having a convex curve illustrated in 4c is averaged to form a rectangular temperature distribution having a height T. It is generally known that amorphous metal is crystallized at a temperature higher than about 400°–600° C. within about several tens minutes although this crystallization temperature various depending upon the composition of the amorphous metal. However, there has not yet been known a temperature in centigrade, which causes the crystallization of amorphous metal within such a very short period of time wherein a locally melted metal due to the explosure to an explosion shock is cooled. Under these circumstances, it is thought that the amorphous metal is exposed to a very high temperature, such as the melting point of metal, due to heat transfer only at the portion tightly contacted with the melted portion of metal, and is exposed to a relatively low temperature in a very short period of time at a portion a little apart from the melted portion of metal. Based on the above assumption, a relation between the surface roughness of a metal and the area of an amorphous metal to be crystallized in the bonding was deduced based on the temperature distribution illustrated in the diagrammatical view of FIG. 4d.

Based on the above described assumption, a method for determining a concrete condition to obtain a good bonding between an amorphous metal thin sheet and a metal is investigated. The heat is generated only at the projection 6 of the metal 5 by the crushing of the projection 6 during the bonding of an amorphous metal thin sheet 2 with a metal 5. The heat to be generated is set to an amount only to change the projection to a melted state. The reason is that, when an amorphous metal thin sheet 2 is pressed to a projection 6 at a high velocity, the shock is selectively applied to the projection 6, and when the projection 6 is crushed, the shock is distributed over a whole flat portion of the metal 5, and the amorphous metal is merely compressed due to the high pressure without substantially causing plastic fluidization, and hence the temperature rising is only about several tens degree in centigrade, which can be substantially ignored, and accordingly the excess energy is probably wholly converted into the kinetic energies of the amorphous metal thin sheet 2 and metal 5. When the volume of the projection 6 per unit area of the surface of the metal 5 is represented by V, the heat Em required for melting the projection 6 is calculated by the following formula $$Em = V \cdot p0 \cdot Cv \cdot Tm + Eml \quad (1)$$

In the above formula, $p0$ represents the density of the metal 5, Cv represents the average value of specific heats of the metal 5 within the range from normal temperatures to the melting temperature Tm, and Eml represents the latent heat in melting of the metal 5. Further, for simplicity, the heat required for melting the metal 5 is assumed to be equally distributed to the amorphous metal thin sheet 2 and the metal 5 during their cooling. The amorphous metal consists substantially of metal element or semi-metal element. It has been ascertained by the experiment carried out later that a practically applicable deduction is possible based on the above described assumption. When the assumption based on the model diagram illustrated in FIG. 4d is added to the above described formula, the following formula can be obtained.

$$Wt = V \cdot (Em - p0 \cdot Cvt \cdot t)/(2 \cdot pa \cdot Cvat) \quad (2)$$

In the above formula, Wt represents the width of that portion of an amorphous metal thin sheet 2 which has a temperature up to t° C. at the bonding interface side, $p0$ represents the density of the amorphous metal thin sheet, t represents the upper limit crystallization temperature, $Cva_t$ and Cvt represent average values of specific heats of the amorphous metal thin sheet (2) and the metal 5, respectively, from normal temperature to the upper limit crystallization temperature t. The reason why the term "$p0 \cdot Cvt \cdot t$" is subtracted from Em is that the heat energy of the metal is subtracted from Em by taking such phenomenon into consideration that the melted portion of the metal has the same temperature as that of the amorphous metal.

When the upper limit crystallization temperature t only is known in the above described formula (2), the relation between the surface roughness of a metal to be bonded with an amorphous metal thin sheet and the width of the crystallized region in the resulting composite article can be calculated. In this case, it must be taken into consideration that the volume V of the projection per unit area of the metal surface varies depending upon the surface roughness of the metal. For example, the calculation of the volume V of projection must be carried out in the different methods between the case where the surface of a metal round rod is cut by a cutting tool having a cutting edge having a circular arc by the use of a lathe, and the case where a substantially random surface state having a certain width, like the sand paper or the grinding wheel is formed. In the former case, the volume V can be calculated from the radius of curvature of the cutting edge of the cutting tool and from the feed of the lathe. In the latter case, the volume V can be calculated by a method, wherein the Ra value is measured by using the surface roughness meter and the wave of the surface of the metal is assumed to be a toothed wave having a certain height Ra. Of course, in the former case, the volume V may be deduced by measuring the Ra value by using the surface roughness meter similarly to the latter case. Therefore, the volume V can be easily found out by a general mathematical knowledge in both cases. The density of metal or amorphous metal can be easily found out in various handbooks and in the manufacturer's catalogue. The values of specific heats (Cv and $Cv_a$) also can be found Out in various handbooks and in the manufacturer's catalogue similarly. However, when the values of Cv and $Cv_a$ cannot be found out in these publications, the values can be calculated by the use of the Debye model. The Debye model is described in the textbook of thermodynamics, and the value of specific heat can be easily calculated by those skilled in the art according to the instruction in the textbook.

When the above described theory was checked with the results of the experiment carried out by the inventors, such a conclusion was obtained that it can be deduced that amorphous metal is crystallized by the exposure to a temperature higher than 900° C.

According to the present invention, the following drawbacks of conventional techniques in the production of amorphous metal-metal composite article have been solved. That is, in the conventional techniques, an amorphous metal thin sheet and a metal were not able to be bonded to each other unless a bonding material, such as adhesive or the like, is used. Further, even when it is intended to bond an amorphous metal thin sheet to a metal by the use of explosion pressure, they can not be satisfactorily bonded to each other, or a good composite article can not be obtained due to the breakage, stain, deformation and the like of its surface. Moreover, even when a composite article having an apparently good bonding state was obtained, a fairly large amount of amorphous metal had been crystallized, or the magnetic properties had been deteriorated in the bonding portions of fellow particles of the amorphous metal powder, and therefore the composite article was not able to exhibit an excellent magnetic property inherent to amorphous metal. On the contrary, according to the present invention, an amorphous metal thin sheet and a metal are treated under a specifically limited condition, whereby a composite article comprising a metal and a substantially homogeneous amorphous metal layer bonded to the metal through a crystallized amorphous metal layer is obtained, and therefore the above described drawbacks of conventional technique have been completely solved, and a very excellent amorphous metal-metal composite article free from the above described drawbacks of conventional amorphous metal-metal composite article can be obtained.

The following examples are given for the purpose of illustration of this invention and are not intended as limitations thereof.

EXAMPLE 1

An amorphous metal thin sheet of 20 mm width × 50 mm length × 25 μm thickness having a composition of $Fe_{78}B_{13}Si_9$ (the numeral represents the atomic % of the element) was superposed on substantially the center portion of that surface of a Cu sheet of 50 mm width × 80 mm length × 2 mm thickness which had previous been adjusted to a surface roughness of 3.2 Ra with a #60 sandpaper by a hand working. A black rubber sheet having the same plane dimension as that of the Cu sheet and having a thickness of 2 mm was superposed on that surface of the amorphous metal thin sheet which was opposite to the surface faced to the Cu sheet such that the edges of both the members were agreed to each other. Further, a cold rolled steel sheet having the same plane dimension as that of the Cu sheet and having a thickness of 1 mm was superposed on that surface of the black rubber sheet which was opposite to the surface faced to the amorphous metal thin sheet such that the edges of both the members were agreed to each other. A commercially available polyvinyl chloride insulating tape was wound around the above obtained combination (hereinafter, referred to as assembly) consisting of Cu sheet-amorphous metal thin sheet-black rubber sheet-cold rolled steel sheet, superposed upwardly from the bottom, under tension such that the edge of the tape of a turn was contacted with the edge of the next turn, whereby the whole surface of the assembly was covered with one layer of the tape.

An explosive of 60 mm width × 120 mm length × 5 mm thickness having a density of 1.4 g/cm³ and having an explosion velocity of 5.5 km/sec was arranged on the upper surface, on the cold rolled steel sheet side, of the assembly, which had been covered with the tape such that the explosive was projected from the assembly by 5 mm in three edges to form 3 marginal explosive areas having a width of 5 mm and by 35 mm in one edge to form one marginal explosive area having a width of 35 mm, and then the superposed mass of the explosive and the assembly were adhered to each other by means of a synthetic resin adhesive such that a clearance was not formed between the explosive and the tape covering the assembly. Then, a No. 6 electric detonator was arranged on the center of the side of the marginal explosive area having a width of 35 mm, and the resulting mass was placed on substantially the center portion of a steel pedestal of 300 mm square having a thickness of 30 mm, which had been placed on the earth, and an electric current was applied to the electric detonator to detonate the explosive.

In the recovered assembly, the cold rolled steel sheet and the black rubber sheet had been flown away, but the amorphous metal thin sheet and the Cu sheet were firmly bonded to each other, and there were observed none of the stain, breakage and deformation of wave shape on the surface of the amorphous metal thin sheet. However, on that surface of the Cu sheet which was bonded to the amorphous metal thin sheet, there was observed soot-like stain, which had probably been formed by the decomposition of the black rubber sheet, on the amorphous metal portion and on the exposed Cu sheet portion. However, this stain was able to be easily removed by wiping with a solvent.

There was no data with respect to the sound velocity in the amorphous metal thin sheet used in the bonding. However, an amorphous metal having a similar composition had a bulk modulus of 141 GPa, and had an actually measured density of 7.18 g/cm³ Accordingly, when the sound velocity in the amorphous metal used in the bonding was calculated by using these values of bulk modulus and density according to the formula (4), the sound velocity was calculated to be 4.431 km/sec. The explosive used in the bonding had an explosion velocity of 5.5 km/sec, which was sufficiently higher than the sound velocity of 4.431 km/sec in the amorphous metal used in the bonding. Further, there has already been explained in this specification that, when the sound velocity in an amorphous metal is not clear, if the moving velocity of the collision point of the amorphous metal thin sheet with a metal is set to at least 5 km/sec, a good bonding of the amorphous metal thin sheet to the metal is obtained. Therefore, this assumption agrees well to the result of experiment.

A part of the bonding portion of the amorphous metal thin sheet and the Cu sheet was cut out by means of a precision cutter while cooling, and then an area ranging from the amorphous metal portion to the bonding interface portion was sliced by means of an ion milling apparatus to prepare a test piece for transmission electron microscope (TEM) observation. The area ranging from the amorphous metal thin sheet to the bonding interface portion was subjected to minute high resolution image observation and electron diffractiometry by means of the TEM. As the result, a crystallized area was observed in the amorphous metal portion in the vicinity of the bonding interface. However, it was confirmed that the crystallization of the amorphous metal did not occur in the portion apart from the amorphous metal-Cu interface by 2.4 $\mu$m or more. While, when the width of the amorphous metal thin sheet, within which the amorphous metal thin sheet to be heated up to 900° C. or more by the heat transfer was deduced by the formulae (1) and (2), the width was calculated to be 2.1 $\mu$m, which was substantially the same as the width of the actually crystallized amorphous metal. That is, it is thought that the deduction of the width of the crystallized portion can obtain an approximate value of the actually obtained width. In general, the temperature of about 500° C., which is generally known as a crystallization temperature of an amorphous metal, is a temperature in the case where the amorphous metal is exposed to a relatively long period of time from several minutes to several hours. On the contrary, according to the present invention, an amorphous metal is exposed to the heating of bonding in a very short period time of less than 1 $\mu$sec ($10^{-6}$ sec), and therefore the amorphous metal is probably not crystallized at the temperature of about 500° C., and the amorphous metal is probably crystallized only in the portion explosed to a temperature higher than about 500° C.

COMPARATIVE EXAMPLE 1

The experiment of Example 1 was repeated, except that there was used a Cu sheet having a surface roughness of 0.8 Ra at the surface faced to the amorphous metal thin sheet, which surface roughness had been obtained by the electropolishing.

In the assembly recovered after the explosion, although the amorphous metal thin sheet and the Cu sheet were apparently bonded to each other, they were able to be easily separated from each other in substantially all portions.

EXAMPLE 2

The experiment of Example 1 was repeated. However, in this Example 2, when an assembly of amorphous metal thin sheet - Cu sheet - black rubber sheet - cold rolled steel sheet was constructed, in place of binding around the assembly by a polyvinyl chloride tape under tension, by a method wherein the edge portion of the assembly was temporarily bound with a polyvinyl chloride tape having a width of 20 mm and a length of 30 mm, and the whole of the temporarily bound assembly was placed in an airtight plastic bag of 100 mm width×200 mm length×0.05 mm thickness, and a copper tube of 10 mm outer diameter×8 mm inner diameter×150 mm length, which had been connected to a vacuum hose and a vacuum pump, was fitted to the mouth of the bag, and the fitted portion was sealed by a polyvinyl chloride tape and bole. The bag containing the assembly therein was placed on substantially the center portion of the same pedestal as used in Example 1 such that the surface of the cold rolled steel sheet was directed upwardly. Separately, an explosive layer of 80 mm width×120 mm length×3 mm thickness having an explosion velocity of 7 km/sec was adhered to the upper surface of an Al sheet having the same plane dimension as that of the explosive and a thickness of 2 mm by means of a synthetic rubber adhesive. Then, the resulting explosive - Al sheet laminate was arranged on the above described bag containing the assembly such that the lower surface of the Al sheet would be faced to the upper surface of the cold rolled steel sheet in a parallel relation with a distance of 10 mm between them by interposing a board in the peripheral edge portion and that the relative plane position of the assembly and the explosive - Al sheet laminate would be the same as that described in Example 1, and the peripheral edge portion of the resulting means was fixed by an adhesive.

When the vacuum pump was actuated to evacuate the interior of the plastic bag to be made into a pressure of not higher than 1 torr, the assembly was strongly pressed by the atmospheric pressure. While keeping this state, the explosive was detonated by the electric detonator, which had been arranged on the center of the side of the marginal explosive portion projected from the edge of the assembly in a larger length, the Al sheet was collided to the upper surface of the cold rolled steel sheet, and a composite article consisting of the Cu sheet and the amorphous metal thin sheet firmly bonded to the Cu sheet was recovered. When the width of the crystallized portion of the amorphous metal was measured in the same manner as described in Example 1, the width was found to be 1.8 $\mu$m.

COMPARATIVE EXAMPLE 2

The same experiment as described in Example 2 was carried out. However, in this Comparative example 2, that surface of a Cu sheet which was faced to an amorphous metal thin sheet was previously abraded with a disc grinder fitted with an alumina grinding wheel of #36 to adjust its surface roughness to 21 Ra. When the assembly was subjected to the same explosion treatment as described in Example 2, an amorphous metal - metal composite article having a good appearance was obtained. However, when the width of the crystallized region of the amorphous metal was measured in three portions, it was found that the average width of the crystallized regions was 13.8 $\mu$m. The widths of the crystallized regions were locally uneven, and therefore there were some regions, in which the width of the remaining non-crystallized region was less than 10 $\mu$m. When the width of the region of amorphous metal, which was heated up to 900° C., was calculated, the calculated width was 14.5 $\mu$m. Therefore, it has been found out that, when the width of the region explosed to 900° C. or higher is calculated, the approximate width of crystallized region can be deduced very well.

EXAMPLE 3

The same assembly as used in Example 1 was produced, except that an amorphous metal thin sheet having a composition of $Ni_{89}P_{11}$ was used. The calculated value of the sound velocity in the amorphous metal having this composition was 3.715 km/sec. As the metal to be bonded with the amorphous metal thin sheet, there was used, instead of the Cu sheet used in Example 1, an industrial grade pure Ti sheet having the same plane dimension as that of the Cu sheet used in Example 1 and a thickness of 1 mm, and having a surface roughness of 4 Ra, which had previously been adjusted by subjecting the Ti sheet surface to a plane polishing by means of a GC grinding wheel of #80. The explosion shock was applied to the assembly by means of a plane wave-generator. The plane wave-generator was constructed in the following manner. To the surface of an Al sheet having a plane dimension of 120 mm × 120 mm and a thickness of 2 mm was adhered an explosive layer, which was the same kind as that of the explosive used in Example 2 and had a plane dimension substantially the same as that of the above described Al sheet and a thickness of 3 mm, by means of a synthetic rubber adhesive, and the resulting explosive - Al sheet laminate was set such that the bottom surface of the Al sheet was inclined at an angle of 12° with respect to the surface to be shocked and that the assembly would be positioned in the center of the projection plane of the Al sheet. Separately, to one surface of another Al sheet, which was the same kind as that of the above described Al sheet and had a dimension of 30 mm width × 150 mm length × 2 mm thickness, was adhered an explosive layer which was the same kind as that of the above described explosive and had substantially the same plane dimension as that of the Al sheet and a thickness of 3 mm, in the same manner as described above. The resulting explosive - Al sheet laminate of 30 mm width × 150 mm length × 5 mm thickness was arranged such that a plane formed by connecting the middle points of four edges of 30 mm length of the explosive - Al sheet laminate of 30 mm width × 150 mm length × 5 mm thickness was agreed to the extension of the plane which bisected the thickness of the explosive of 120 mm square into two equal parts, that one end of the length direction of the Al sheet of 30 mm width × 150 mm length was contacted to one end of the side of 120 mm of the above described explosive of 120 mm square, and the other end of the length direction of the Al sheet was apart from the other end of the side of 120 mm of the above described explosive of 120 mm square, and further that the surface of the Al sheet of 30 mm width × 150 mm length, which surface was not adhered with the explosive, was arranged perpendicularly to the extension plane of the plane of the explosive of 120 mm square while maintaining an angle of 12° with respect to the side of 120 mm on the extension plane of the explosive of 120 mm square.

The above described assembly was arranged on the same steel sheet as described in Example 1, and a No. 6 electric detonator was set at the end, the position of which end was farthest form the explosive of 120 mm square, of the side of 150 mm length of the explosive having a plane dimension of 30 mm width × 150 mm length of the above described plane wave-generator, and the explosive of 30 mm × 150 mm was detonated from its one end by the electric detonator. As the result, the Al sheet adhered to the explosive was flown at a high velocity and collided to one side of the explosive of 120 mm square substantially simultaneously over its entire length, whereby the explosive of 120 mm square was detonated forming a linear detonation wave. By the explosion of the explosive of 120 mm square, the Al sheet adhered to the lower surface of the explosive was flown downwardly at a high velocity and collided at a velocity of 1.5 km/sec to the upper surface of the steel sheet covered with the polyvinyl chloride tape. In this collision, the entire area of the upper surface of the steel sheet was applied with a so-called plane wave shock substantially simultaneously by the Al sheet of 120 mm square. In the plane wave shock, the moving velocity of the collision point of an amorphous metal thin sheet to a metal can be considered to be infinite, and therefore the requirement for the moving velocity of the collision point relative to the sound velocity in the amorphous metal is fully satisfied.

In the recovered assembly, the amorphous metal thin sheet and the Ti sheet were firmly bonded with each other. When the width of the crystallized area of the amorphous metal was measured in the same manner as described in Example 1, the width was found to be 9.8 $\mu$m. When the width of the area of the amorphous metal which would be explosed to a temperature of 900° C. or higher was calculated, the width was calculated to be 10.0 $\mu$m. Therefore, there is a high approximation in the width of the crystallized area of amorphous metal between the calculated value and the actually obtained value.

COMPARATIVE EXAMPLE 3

The same experiment as descried in Example 3 was carried out, except the following. A plane wave-generator was set such that the detonation side end of the generator was near to the upper surface of a steel sheet covered with the polyvinyl chloride tape and another end of the generator was far to the upper surface of the steel sheet covered with the polyvinyl chloride tape, and an angle of 12° was formed between the Al sheet of the bottom surface of the plane wave-generator and the upper surface of the steel sheet covered with the polyvinyl chloride tape. The explosion-treated assembly was recovered in a state that the amorphous metal thin sheet was firmly bonded to the Ti sheet. However, a wave-shaped strain was observed on the upper surface of the amorphous metal, and a part of the amorphous metal was broken at the pit of the deformed wave shape, and the Ti sheet was observed from the broken portion of the amorphous metal. Moreover, there were broken portions in the edge portion of the amorphous metal in a width of about 1-2 mm from the edge to the interior over a length of 3-30 mm.

The moving velocity of the collision point of the amorphous metal thin sheet to the metal sheet was 3.5 km/sec and was lower than the sound velocity of 3.715 km/sec in the amorphous metal obtained by calculation.

EXAMPLE 4

The outer peripheral surface of an SUS 304 stainless steel round rod having a length of 200 mm and a diameter of 22 mm was worked by a lathe to adjust its surface roughness to 2.1 Ra, and an amorphous metal thin sheet having a width of 50 mm and a thickness of 28 $\mu$m was wound around by one turn the center portion in the longitudinal direction of the above treated SUS 304 stainless steel round rod such that the turn ends of the wound amorphous metal thin sheet would be face to face with each other without a gap, and a polyvinyl chloride tape was wound around the wound amorphous metal thin sheet under tension such that the edge of the polyvinyl chloride tape in a turn was contacted to the edge in the next turn of the tape, whereby the amorphous metal thin sheet was fixed to the stainless steel round rod. In this case, the polyvinyl chloride tape was wound around such that not only the peripheral surface of the amorphous metal thin sheet, but also the whole peripheral surface of the stainless steel round rod were covered. The amorphous metal thin sheet had a composition of $Co_{66}Fe_4Ni_1B_{14}Si_{15}$, and the calculated sound velocity in the amorphous metal was 4.676 km/sec. A black rubber sheet having a width of 200 mm and a thickness of 2 mm was wound around by one turn the outside of the polyvinyl chloride tape such that both the turn ends of the black rubber sheet would be face to face with each other without a gap, and then the rubber sheet was fixed by means of a synthetic rubber adhesive. Then, the above obtained mass was covered with a copper tube having a length of 200 mm, an outer diameter of 30 mm and a thickness of 1.5 mm such that both the ends of the copper tube was agree to both ends of the stainless steel round rod, and both the end portions of the resulting assembly were sealed with a polyvinyl chloride tape. The resulting assembly was embedded in a cylindrical explosive having a length of 280 mm and a diameter of 70 mm such that both the center axis of the cylindrical explosive and that of the assembly were agreed to each other and that one end of the assembly was 20 mm inside from one end of the explosive and the other end of the assembly was 60 mm inside from the other end of the explosive. The above used explosive had an explosion velocity of 5.9 km/sec and a specific weight of 1.3 $g/cm^3$.

When a No. 6 electric detonator was arranged at the center portion of that side of the explosive which is a marginal portion having a width of 60 mm from the end of the assembly, and detonated, the assembly was recovered in the form of substantially the original shape. However, the outer diameter of the copper tube arranged in the outermost periphery was shrunk to about 26 mm in average. When the copper tube was cut and removed by means of a cutting grinding wheel, it was observed that the amorphous metal thin sheet and the stainless steel round rod were firmly bonded to each other, and there were neither surface stain which was not able to be cleaned, nor deformation of wave shape, nor breakage of amorphous metal, nor poorly bonded portions.

When the bonding area portion was observed in the same manner as described in Example 1, the width of the crystallized area of the amorphous metal was found to be 1.3 $\mu$m. While, the deduced with of the crystallized portion was 1.9 $\mu$m.

COMPARATIVE EXAMPLE 4

The experiment of Example 4 was repeated. However, in this Comparative example 4, the surface of the stainless steel round rod was adjusted to a surface roughness of 0.5 Ra by a cylindrical grinding, and when the amorphous metal thin sheet was wound around the stainless steel round rod, iron powders having an average particle size of 160 $\mu$m were arranged between both the members in an amount of about 10 particles per 10 $mm^2$ to form a clearance keeping both the members in parallel. When the copper tube arranged on the outer periphery of the recovered assembly was removed, and the bonding state of the amorphous metal thin sheet and the stainless steel round rod was observed, the amorphous metal thin sheet was broken into strips, which had a narrow width of about 1–3 mm and were broken in several portions along substantially the circumference, and whose adjacent strips were bonded in several portions, and the stainless steel round rod was observed in the gap formed between the adjacent narrow strips. Further, the amorphous metal thin sheet was not at all bonded to the metal sheet at the edge portion, and the amorphous metal thin sheet at the edge portion was broken into strips having a width of 2–5 mm in substantially all portions.

As described above, the present invention has developed an explosion bonding technic, which can bond firmly an amorphous metal thin sheet to a metal while maintaining the amorphous state in the portion other than the close vicinity of the interface, by adjusting the surface roughness of the surface of the metal to be bonded with the amorphous metal thin sheet. As the result, the drawbacks of conventional technics, which are poor in the bonding strength, durability, reliability (particularly, at high temperatures) and the like due to the fact that an amorphous metal thin sheet can not be bonded to a metal unless an adhesive is used, are able to be completely solved.

As the amorphous metal to be used in the present invention, there can be used amorphous metals consisting of Fe, Co and Ni base alloys and most of other alloys. As the metal to be bonded with the amorphous metal thin sheet, there can be used Cu, Al, Ti and other substantially all metals.

The present invention can be utilized in the production of various materials using amorphous metal thin sheet, such as magnetic part, high-hardness composite article, corrosion resistant material and electrical part, and particularly utilized in the production of magnetic sensor, magnetic shield, magnetic filter and the like.

Further, in the present invention, each of two kinds of $Fe_{78}B_{13}Si_{19}$ and $Fe_{67}Co_{18}B_{14}Si_1$ amorphous metal thin sheets having a high magnetostriction was bonded by explosion to a SUS 304 stainless steel round rod or a Ti round rod to produce a torque sensor shaft, and a magnetostriction-type non-contacting torque sensor was produced by using the torque sensor shaft. When the sensor property of the resulting torque sensor was measured, the resulting torque sensor was equal to or superior in the sensitivity to the torque sensor, which uses a permalloy and is the same type as the above obtained magnetostriction-type non-contacting torque sensor. Further, the resulting magnetostriction-type non-contacting torque sensor had a good linearlity between the output power and the torque, and was very low in the hysteresis. Therefore, the magnetostriction-type non-contacting torque sensor using the amorphous metal-metal composite article according to the present invention is superior in the sensor property to the torque sensor using a permalloy.

What is claimed is:

1. An amorphous metal-metal composite article, comprising a metal and an amorphous metal thin sheet bonded together by an explosion with the bonding interface between the amorphous metal thin sheet and the metal being substantially plane, and having a crystallized portion, which has been formed by the crystallization of the amorphous metal during the bonding, being present along the interface of the amorphous metal and the metal, and the width of the non-crystallized portion of the amorphous metal being at least 10 $\mu$m, and the noncrystallized portion of the amorphous metal thin sheet being substantially homogeneous.

2. A method for producing an amorphous metal-metal composite article, wherein an amorphous metal thin sheet is bonded to a metal by applying an explosion shock to an assembly comprising the metal and the amorphous metal thin sheet superposed thereon, the improvement comprising plastically deforming a rough portion on the metal surface by the collision of the amorphous metal, which has been closed in contact tightly to the rough surface of the metal sheet, at a high velocity to the rough surface of the metal such that the moving velocity of the colliding portion, at which the amorphous metal thin sheet is pressed to the metal, is higher than the sound velocity in the amorphous metal and the width of that portion of the amorphous metal which is heated to a temperature higher than 900° C. is smaller than the value obtained by subtracting 10 μm from the thickness of the amorphous metal under an assumption that the rough portion on that surface of the metal which is faced to the amorphous metal has been wholly melted by the heat generated by the collision, and the heat has been equally distributed to the limited width of the amorphous metal and the metal.

3. A method according to claim 2, wherein that surface of the metal which is faced to the amorphous metal has a center line average surface roughness of 1-10 μm.

4. A method according to claim 2, wherein the metal sheet and the amorphous metal thin sheet are tightly closed in contact to each other by reducing the pressure of the air existing between the interfacial portion of both the members.

5. A method according to claim 2, wherein the metal sheet and the amorphous metal thin sheet are tightly closed in contact to each other by the restoring power of an elastomer.

* * * * *